United States Patent
Hikita et al.

(10) Patent No.: US 7,659,795 B2
(45) Date of Patent: Feb. 9, 2010

(54) ANTENNA DUPLEXER AND WIRELESS TERMINAL USING THE SAME

(75) Inventors: Mitsutaka Hikita, Hachioji (JP); Nobuhiko Shibagaki, Kokubunji (JP); Shigeki Matsuda, Nomi (JP); Naoki Matsuura, Yokohama (JP); Kazuyuki Yokoyama, Yokohama (JP)

(73) Assignees: Hitachi, Ltd., Tokyo (JP); Hitachi Media Electronics Co., Ltd., Mizusawa (JP)

( * ) Notice: Subject to any disclaimer, the term of this patent is extended or adjusted under 35 U.S.C. 154(b) by 0 days.

(21) Appl. No.: 12/216,646

(22) Filed: Jul. 9, 2008

(65) Prior Publication Data
US 2008/0272854 A1  Nov. 6, 2008

Related U.S. Application Data

(62) Division of application No. 11/197,500, filed on Aug. 5, 2005, now abandoned.

(51) Int. Cl.
*H03H 7/46* (2006.01)
*H04B 1/44* (2006.01)
*H03H 9/70* (2006.01)

(52) U.S. Cl. .................. 333/132; 333/101; 333/129; 333/133; 455/83

(58) Field of Classification Search ............ 333/101, 333/126, 129, 132–134; 455/83, 168.1
See application file for complete search history.

(56) References Cited

U.S. PATENT DOCUMENTS

| 5,513,382 | A | 4/1996 | Agahi-Kesheh et al. |
| 5,564,076 | A | 10/1996 | Auvray |
| 5,838,735 | A | 11/1998 | Khullar |
| 6,115,592 | A | * | 9/2000 | Ueda et al. .............. 455/307 |
| 6,370,205 | B1 | 4/2002 | Lindoff et al. |

(Continued)

FOREIGN PATENT DOCUMENTS

EP  0964477  1/2002

(Continued)

OTHER PUBLICATIONS

Hikita, M. et al, "Investitgation of Merged RX-Differential Output for Multi-Band SAW Front-End Module", IEEE Ultrasonic Symposium, 2003, pp. 393-396.

(Continued)

*Primary Examiner*—Barbara Summons
(74) *Attorney, Agent, or Firm*—Mattingly & Malur, P.C.

(57) ABSTRACT

A technology which can realize a high-performance multi-band operation in a compact circuit configuration and is advantageous for a wireless terminal of GSM system for which the further increase of the demands is expected in the future is provided. Provided is a multiband switch type antenna duplexer adopted in a mobile phone used in TDMA system such as the GSM system, in which the signals of respectively different first to fourth frequency bands (GSM 850, EGSM, DCS, PCS) share a single antenna, wherein switching elements such as receive filters and diodes are combined in various ways to perform the high-performance band switch with the minimum number of switching elements. The circuit of this antenna duplexer can realize not only the size reduction of the multiband switch antenna duplexer but also the size reduction and performance improvement of the wireless terminal itself.

1 Claim, 15 Drawing Sheets

U.S. PATENT DOCUMENTS

| | | |
|---|---|---|
| 6,606,015 B2 | 8/2003 | Uriu et al. |
| 6,606,016 B2 * | 8/2003 | Takamine ................... 333/133 |
| 6,714,099 B2 | 3/2004 | Hikita et al. |
| 6,766,149 B1 | 7/2004 | Hikita et al. |
| 6,835,968 B2 | 12/2004 | Kitazawa et al. |
| 7,003,312 B2 | 2/2006 | Kemmochi et al. |
| 7,010,273 B2 * | 3/2006 | Satoh et al. ................... 455/83 |
| 7,035,602 B2 | 4/2006 | Satoh et al. |
| 7,127,215 B2 | 10/2006 | Nakamura et al. |
| 7,142,884 B2 | 11/2006 | Hagn |
| 7,239,853 B2 | 7/2007 | Kearns |
| 7,242,268 B2 * | 7/2007 | Hagiwara et al. ........... 333/133 |
| 7,253,702 B2 | 8/2007 | Kemmochi et al. |
| 2002/0183016 A1 | 12/2002 | Kemmochi et al. |
| 2004/0132487 A1 | 7/2004 | Kearns |
| 2005/0245201 A1 | 11/2005 | Ella et al. |

FOREIGN PATENT DOCUMENTS

| | | |
|---|---|---|
| JP | 6268552 | 9/1994 |
| JP | 08-321738 * | 12/1996 |
| JP | 10-079601 * | 3/1998 |
| JP | 11-154804 | 6/1999 |
| JP | 11-355174 | 12/1999 |
| JP | 2001-160766 | 6/2001 |
| JP | 2002-171198 | 6/2002 |
| JP | 2002-185356 | 6/2002 |
| JP | 2002-261651 | 9/2002 |
| JP | 2003-078443 | 3/2003 |
| JP | 2003-204284 | 7/2003 |
| JP | 2004-193866 | 7/2004 |
| JP | 2004-194310 | 7/2004 |
| JP | 2004/ 297633 | 10/2004 |
| WO | 01/48935 | 7/2001 |
| WO | 02/37709 | 5/2002 |
| WO | WO 2004/038913 * | 5/2004 |

OTHER PUBLICATIONS

Hikita, M. et al, "Investigation of SAW W-CDMA Antenna Duplexer and GSM-Based FEM Including Duplexer", IEEE International Ultrasonics, Ferroelectrics, and Frequency Control $50^{th}$ Annv. Conf., 2004, pp. 970-973.

Hikita, M. et al, "Recent and Future Trends for RF SAW Module Used in Mobile Communications", IEICE Journal, vol. 86, No. 10, Oct. 2003, pp. 786-792.

* cited by examiner

PIEZOELECTRIC SUBSTRATE

PIEZOELECTRIC VIBRATOR

SUBSTRATE

CHIP SUBSTRATE

CHIP SUBSTRATE

CHIP SUBSTRATE

ANTENNA DUPLEXER AND WIRELESS TERMINAL USING THE SAME

CROSS-REFERENCES

This is a divisional application of U.S. Ser. No. 11/197,500, filed Aug. 5, 2005 (now abandoned), the contents of which is incorporated herein by reference.

TECHNICAL FIELD OF THE INVENTION

The present invention relates to an antenna duplexer (a radio frequency (abbreviated as RF, hereinafter) circuit for antenna duplexer) which makes it possible to achieve the multiband wireless terminal suitable for a mobile phone or the like in the TDMA (Time Division Multiple Access) system such as the GSM (Global System for Mobile Communications) mobile phone. More particularly, it relates to a technology effectively applied to the case where the antenna duplexer (RF circuit for antenna duplexer) is adopted to realize a compact and high-performance terminal.

BACKGROUND OF THE INVENTION

Conventionally, when realizing the multiband operation in a wireless terminal in the TDMA system, an antenna switch module in which a plurality of switches for selecting the transmitting and receiving frequency signals corresponding to each band are provided right behind the antenna has been used. For example, as shown in FIG. 1, the demand from the dual-band terminal of the 900 MHz EGSM (Extended GSM) and the 1.8 GHz DCS (Digital Communication Systems) to the triple-band terminal obtained by adding the 1.9 GHz PCS (Personal Communication Service) and to the quad-band terminal obtained by further adding the 850 MHz GSM has been increasing.

SUMMARY OF THE INVENTION

Incidentally, in the above-described wireless terminal in the TDMA system, with the increase of the demand for the multiband terminal, for example, from the dual-band terminal of the 900 MHz EGSM and the 1.8 GHz DCS to the triple-band terminal obtained by adding the 1.9 GHz PCS and to the quad-band terminal obtained by further adding the 850 MHz GSM, the operation thereof has become more and more difficult. More specifically, along with the increase of the demand for the multiband terminal, the number of switches to be used exponentially increases.

In such a circumstance, the present invention is intended to solve the problem of the exponential increase of the number of switches to be used, and an object of the present invention is to provide the technology which is capable of achieving the high-performance multiband operation with the compact circuit configuration and is quite effective for the wireless terminal of the GSM system, for which the further increase of the demands is expected in the future.

The above and other objects and novel characteristics of the present invention will be apparent from the description of this specification and the accompanying drawings.

The typical ones of the inventions disclosed in this application will be briefly described as follows.

In the present invention, the band selection function to switch the bands for the multiband operation is equivalently provided not only to the switches but also to the filters on the latter stage used in the receiver system. By doing so, the number of switches can be greatly reduced even for the quad-band terminal having the largest number of bands at present. In particular, a surface acoustic wave (abbreviated as SAW hereinafter) filter or a film bulk acoustic resonator (abbreviated as FBAR hereinafter) filter is used for the filter unit, and a pin diode, or a GaAs switch or a MEMS (Micro-Electronic-Mechanical System) switch is used for the switch unit. Therefore, the further effect for the size reduction can be obtained.

In addition, a new synthesis method of output signals from two receive filters is proposed to solve the problem of the increase in the number of pins resulting from the recent combination with an IC for a direct conversion (abbreviated as DC hereinafter) demodulation system or an IC for low-intermediate frequency (abbreviated as IF hereinafter) demodulation system.

Also, a new antenna duplexer (RF circuit for antenna duplexer) is proposed to achieve the multiband operation by the arbitrary combination in wireless terminals which are assumed to be mass-produced. Furthermore, a new circuit configuration is provided to facilitate the calibration of the direct current offset caused when combined with the IC for DC demodulation system or the IC for low-IF demodulation system.

That is, the antenna duplexer according to the present invention comprises: a single antenna terminal for transmitting and receiving signals of respectively different first to fourth frequency bands; first means for filtering the signals of the first to fourth frequency bands received by the single antenna terminal into the signals of the first and second frequency bands and the signals of the third and fourth frequency bands; second means for filtering the signals of the first and second frequency bands filtered by the first means into the signals of the first frequency band and the signals of the second frequency band; third means for filtering the signals of the third and fourth frequency bands filtered by the first means into the signals of the third frequency band and the signals of the fourth frequency band; and first to fourth output terminals each outputting the signals of the first to fourth frequency bands filtered by the second means and the third means.

More specifically, an antenna duplexer according to the present invention is applied to a multiband switch type antenna duplexer in which signals of respectively different first to fourth frequency bands share a single antenna, and when a transmitting frequency band fT and a receiving frequency band fR of the first to fourth frequency bands are respectively denoted as fT(1) to fT(4) and fR(1) to fR(4), in the case where the highest frequency of fT(1), fR(1), fT(2) and fR(2) is lower than the lowest frequency of fT(3), fR(3), fT(4) and fT(4), fT(1)<fR(2) and fT(3)<fR(4) are satisfied, and fR(1) partially overlaps fT(2) and fR(3) partially overlaps fT(4), the antenna duplexer forms the connection configuration as follows.

For example, receive filters corresponding to each of the first to fourth frequency bands are provided, output terminals for reception are independently formed on an output side of the receive filters, and input terminals thereof are connected in parallel to each other via a matching circuit and a phase shift circuit, thereby forming first and third parallel connection points, the first parallel connection point corresponding to the first and second frequency bands is further connected in parallel to a switching element for transmission, which is connected to a common input point on the transmission side corresponding to the first and second frequency bands, via a switching element and a quarter wavelength phase shift circuit, thereby forming a second parallel connection point, the third parallel connection point corresponding to the third and fourth frequency bands is further connected in parallel to a switching element for transmission, which is connected to a common terminal on the transmission side corresponding to the third and fourth frequency bands, via a switching element and a quarter wavelength phase shift circuit, thereby forming a fourth parallel connection point, and the second parallel connection point and the fourth parallel connection point are connected in parallel to each other with using an antenna terminal as a common terminal, via a low-frequency pass filter and a high-frequency pass filter, respectively.

Also, another antenna duplexer according to the present invention is applied to a multiband switch type antenna duplexer in which signals of respectively different first to fourth frequency bands share a single antenna, and when a transmitting frequency band fT and a receiving frequency band fR of the first and second frequency bands are respectively denoted as fT(1) and fT(2) and fR(1) and fR(2), in the case where fT(1)<fR(2) is satisfied and fR(1) partially overlaps fT(2), the antenna duplexer forms the connection configuration as follows.

For example, receive filters corresponding to the first and second frequency bands are provided, input terminals on the input side of said receive filters are connected in parallel to each other via a matching circuit and a phase shift circuit, thereby forming a first parallel connection point, the first parallel connection point is connected in parallel to a switching element for transmission, which is connected to a common input terminal on the transmission side corresponding to the first and second frequency bands, via a switching element and a quarter wavelength phase shift circuit, thereby forming a second parallel connection point, the second parallel connection point is directly connected to an antenna terminal or connected to the antenna terminal via a low-frequency pass filter or a high-frequency pass filter, and the output terminals of the receive filters corresponding to the first and second frequency bands are connected in parallel to each other via a switching element and via a switching element and a quarter wavelength phase shift circuit, respectively, thereby forming a third parallel connection point, and the third parallel connection point is used as an output terminal for reception.

Alternatively, the connection configuration obtained by changing the input side and the output side of the receive filters in the above-described configuration and that obtained by changing the circuits and elements interposed between the first parallel connection point and the second parallel connection point and between the first parallel connection point and the third connection point in the above-described configuration are also available.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
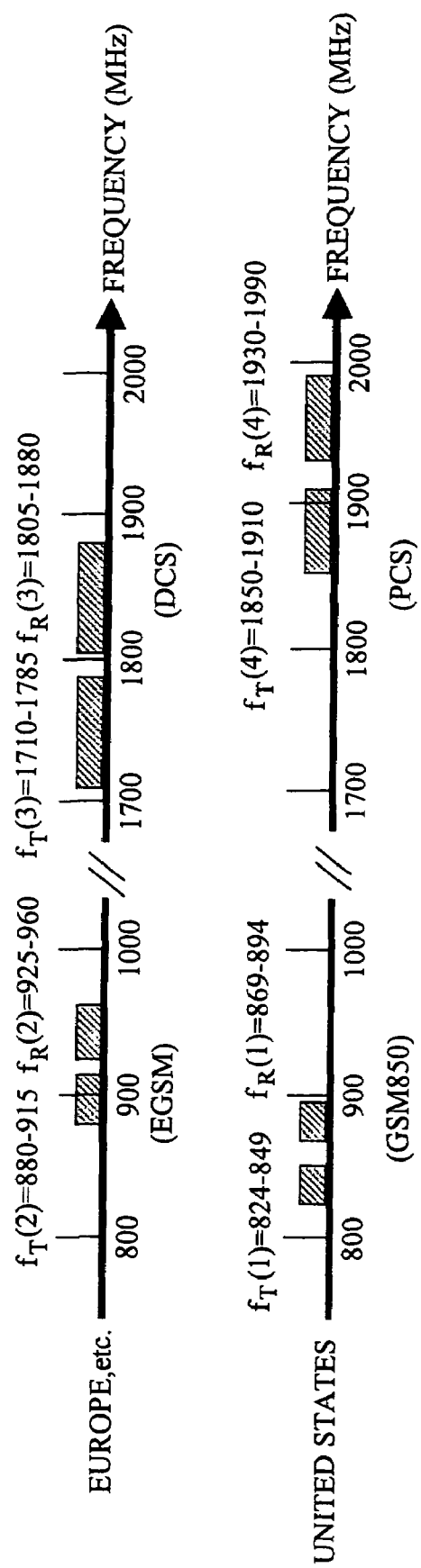
FIG. 1 is a diagram showing an example of the frequency allocation of the GSM mobile phone system.

FIG. 1 is a diagram showing an example of a frequency allocation of the GSM mobile phone system. The frequency allocation of the GSM mobile phone system adopted in more than half of the world mainly in Europe, that is, the frequency allocation adopted in Europe is the 900 MHz EGSM and the 1.8 GHz DCS, and that adopted in the United States is the 850 MHz GSM and the 1.9 GHz PCS.

As shown in FIG. 1, in the United states and Europe, the transmitting frequency band (fT) is located on a lower side of the receiving frequency band (fR) because of the easiness of the circuit configuration of the wireless terminal. In the recent wireless terminal, the dual-band terminal which can handle both frequencies of EGSM and DCS with a single terminal has become more and more popular. Also, for a business person or the like who goes back and forth between Europe and the United States, it is preferable that the same terminal can be used in both Europe and the United States. Consequently, the demands for the triple-band terminal obtained by adding PCS to the dual-band terminal and the quad-band terminal obtained by adding both PCS and GSM 850 has been increasing.

First Embodiment

Figure 2:
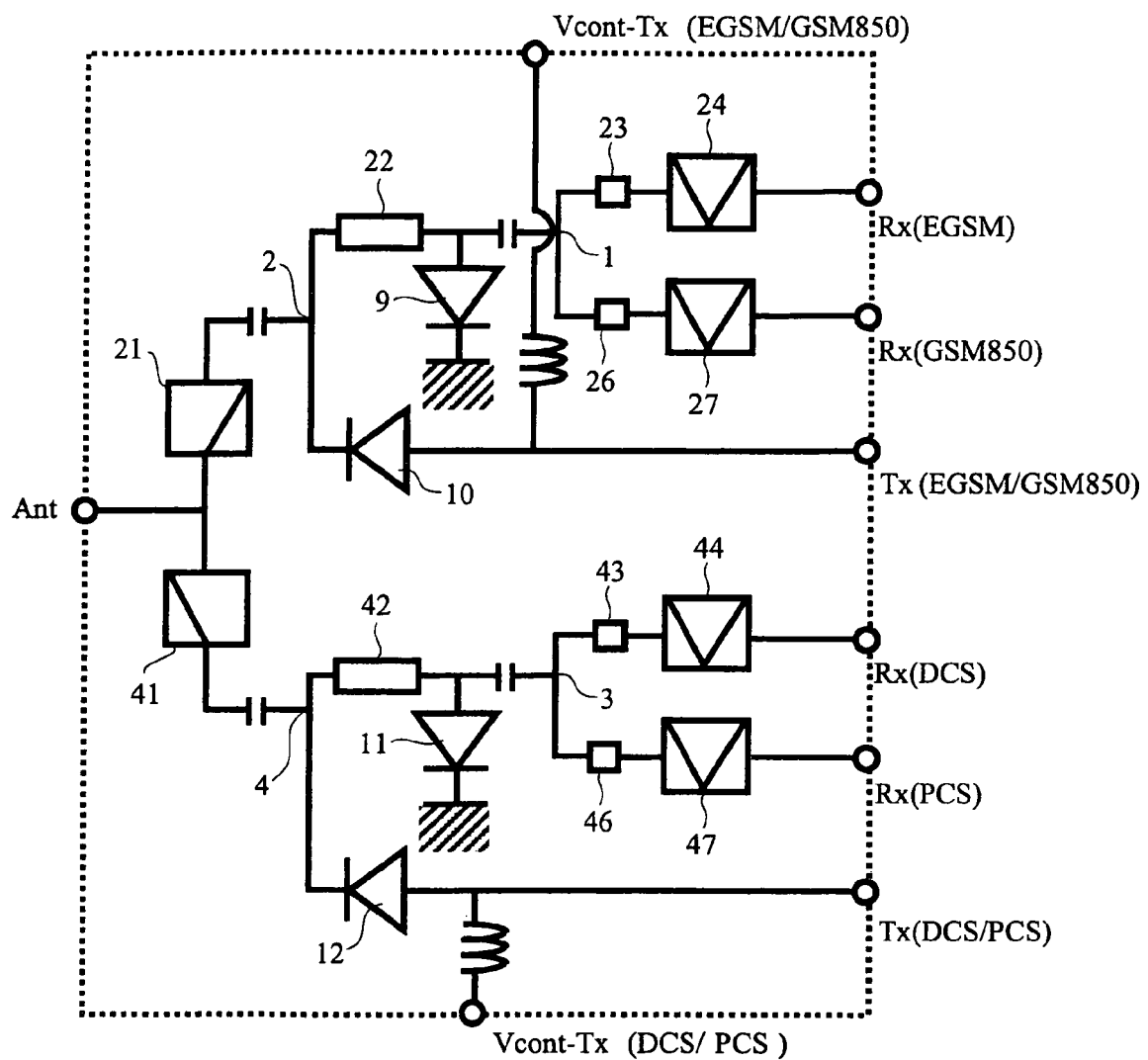
FIG. 2 is a block diagram showing a quad-band switch type antenna duplexer according to the first embodiment of the present invention.

FIG. 2 shows an example of the first embodiment of the present invention. An example of the RF circuit for antenna duplexer assumed to be used for the quad-band terminal is shown in FIG. 2. By the adoption of this RF circuit, it becomes possible to pair the transmitting and receiving frequencies of each system and to handle the bands corresponding to four systems of the respective frequencies of EGSM, DCS, PCS and GSM 850 with a single antenna.

Figure 10:
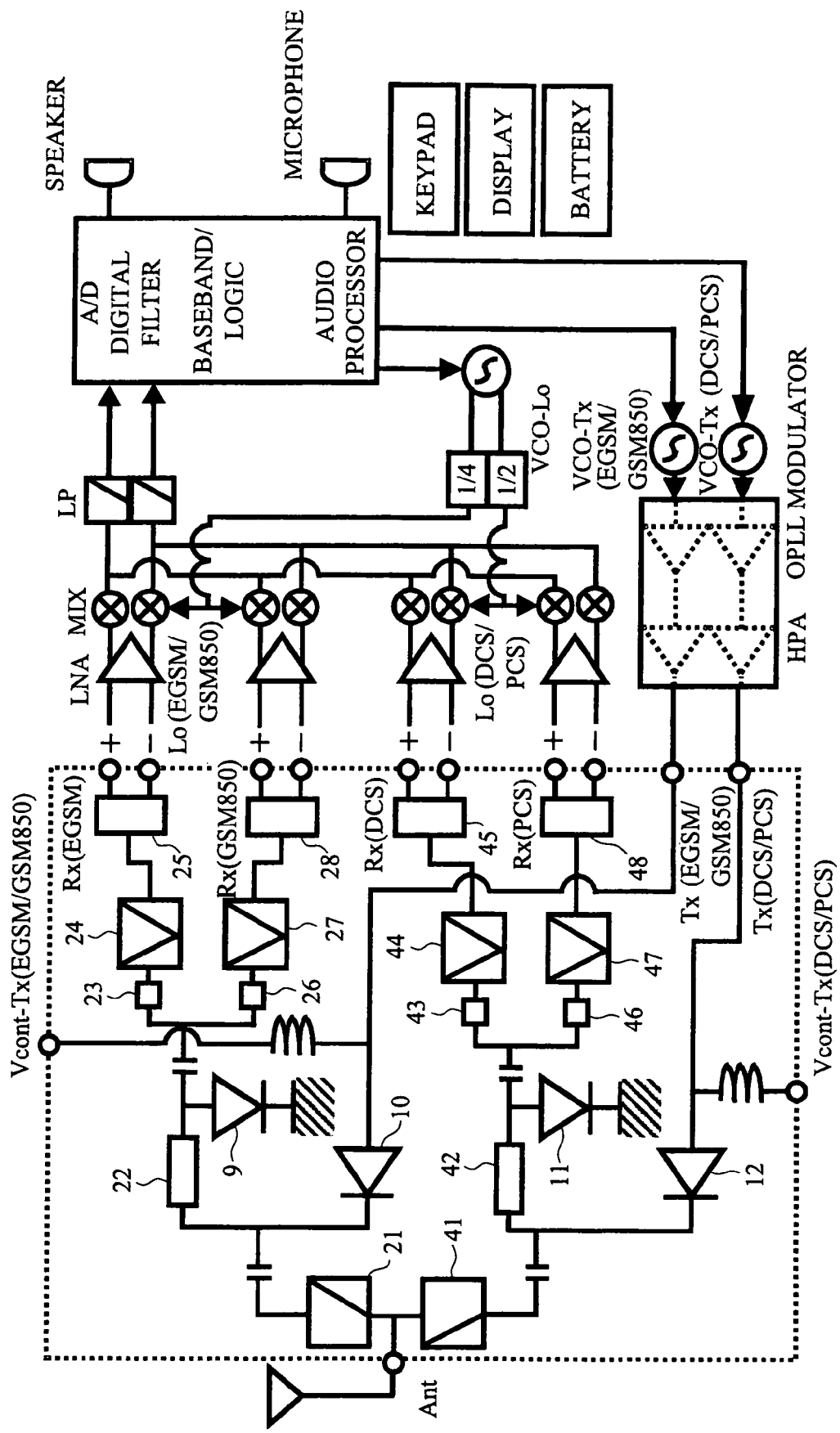
FIG. 10 is a block diagram showing a wireless terminal of the DC demodulation system or the low IF demodulation system using the antenna duplexer according to the present invention.

First, the configuration of the wireless terminal will be described in brief with using the quad-band terminal as an example. FIG. 10 is a simplified block diagram showing the wireless terminal. Since it handles the RF signals of both 824 to 960 MHz band and 1.71 to 1.99 GHz band, the circuit is generally large and complicated. Various types of new circuit systems have been proposed for the size reduction of the terminal. In the OPLL (Offset Phase Lock Loop) modulation method adopted in the transmitter system, the modulation is directly applied to the VCO (Voltage Controlled Oscillator) by the output of the PLL circuit. As a result, the circuit configuration of the transmitter system can be significantly simplified. Meanwhile, with respect to the receiver system, the study for the DC demodulation system in which the relatively high IF as the conventional system is not used and frequencies of the receiving signal and the local signal are made equal and that for the low IF demodulation system in which they differ only slightly have been started. FIG. 10 is a block diagram showing the case where the OPLL modulation system is used for the modulation system and the DC demodulation system is used for the receiver system.

In general, the size of RF-IC which adopts the above-described modulation system and demodulation system is quite large. Also, since the RF signals of both 824 to 960 MHz band and 1.71 to 1.99 GHz band are handled in the chip, it is much influenced by the crosstalk between signal lines and the common-mode noise from the earth. In the receiver system, in particular, it is known that the influence by the common-mode noise can be reduced by using a differential type signal line in the RF circuit. Therefore, in the receiver system in the block diagram shown in FIG. 10, the RF circuits in the RF-IC are all composed of the differential type circuits.

The antenna duplexer according to the present invention enclosed by dotted lines in FIG. 10 separates the transmitting and receiving signals, transmits the transmitting signals from the transmitter to the antenna and the minute receiving signal from the antenna to the receiver as a differential signal of the RF. By doing so, the transmission and reception by the single antenna can be realized. Also, the antenna duplexer for the quad-band terminal separates the RF signal of 824 to 960 MHz band and the RF signal of 1.71 to 1.99 GHz band. More concretely, since the frequency of the EGSM and that of the GSM 850 are close to each other in the transmission RF signal, both the transmission signals are commonly amplified to about 2 W by the high power amplifier (abbreviated as HPA hereinafter) of the 824 to 915 MHz band. In addition, since the frequencies of the transmission signals of the DCS and PCS are close to each other, both the transmission signals are amplified to about 1 W by another HPA of the 1710 to 1910 MHz band. Then, they are supplied to the corresponding transmitting terminals of the antenna duplexer.

First, the RF signal of 869 to 960 MHz band and the RF signal of 1.805 to 1.99 GHz band are separated from the receiving RF signal by the antenna duplexer, and then, they are separated into the RF signals of EGSM and GSM 850 and those of DCS and PCS by each two filter, that is, total of four filters. These RF signals are converted into differential signals by a balun circuit and supplied to the low noise amplifier (abbreviated as LNA hereinafter) by the receiving terminal. The RF signals passing through the LNA are converted into the signals of baseband by a mixer (abbreviated as MIX hereinafter) and then demodulated as sound or data after passing through a signal processing circuit, a baseband logic, and the like.

Based on the description of the entire configuration diagram of the terminal shown above, the RF circuit for antenna duplexer for the quad-band terminal shown in FIG. 2 according to the first embodiment of the present invention will be described. As shown in the frequency allocation in FIG. 1 including the examples of Europe and the United State, in the course of progress of the mobile communication, the service of the initial system was started at the frequency of 1 GHz or lower in each country and thereafter the new system at the frequency of 1 to 2 GHz was added. Therefore, when the transmitting and receiving frequencies of the European system (EGSM, DCS) and the US system (GSM 850, PCS) are arranged in increasing order, and the transmitting and receiving frequencies of the GSM 850, that is, those of the first system are denoted as fT(1) and fR(1), the transmitting and receiving frequencies of the EGSM, that is, those of the second system are denoted as fT(2) and fR(2), the transmitting and receiving frequencies of the DCS, that is, those of the third system are denoted as fT(3) and fR(3) and the transmitting and receiving frequencies of the PCS, that is, those of the fourth system are denoted as fT(4) and fR(4), this RF circuit for antenna duplexer is particularly important in the system configuration in which the highest frequency of fT(1), fR(1), fT(2) and fR(2) is lower than the lowest frequency of fT(3), fR(3), fT(4) and fT(4) and in the system in which fT(1)<fR(2) and fT(3)<fR(4) are satisfied and fR(1) partially overlaps fT(2) and fR(3) partially overlaps fT(4) as shown in FIG. 1.

As shown in FIG. 2, a low-frequency pass filter 21 and a high-frequency pass filter 41 are connected to an antenna terminal Ant in parallel to each other, and the signals corresponding to the first and second systems are transmitted and received via the low-frequency pass filter 21 through the path shown in the upper part of FIG. 2 and the signals corresponding to the third and fourth systems are transmitted and received via the high-frequency pass filter 41 through the path shown in the lower part of FIG. 2. The receive filters 27 and 24 corresponding to the first and second systems and the receiver filters 44 and 47 corresponding to the third and fourth systems are provided, and the output terminals for reception Rx(GSM 850), Rx(EGSM), Rx(DCS) and Rx(PCS) are independently formed on the output side of the above-described filters as shown in FIG. 2. On the input side, the input terminals thereof are connected in parallel to each other via matching circuit/phase-shift circuits 26, 23, 43 and 46 under the condition that, at the frequency in the pass band of each filter, the impedance in the other filter becomes high impedance (that is, the condition that the impedance in the filter (EGSM) 24 becomes high impedance at fR(1) and the impedance in the filter (GSM 850) 27 becomes high impedance at fR(2), similarly, the impedance in the filter (PCS) 47 becomes high impedance at fR(3) and the impedance in the filter (DCS) 44 becomes high impedance at fR(4)), and a first parallel connection point 1 and a third parallel connection point 3 are formed.

The first parallel connection point 1 corresponding to the first and second systems is connected to a second parallel connection point 2 via a diode (switching element) 9, which is connected to the ground at the time of the transmission in the first or second system and becomes conductive at the time of the reception, and an equivalent quarter wavelength phase shift circuit 22. Other circuit connected to the second parallel connection point 2 is composed of a diode (switching element for transmission) 10, which is connected to a common input terminal Tx (EGSM/GSM 850) on the transmission side corresponding to the first and second systems, becomes conductive at the time of the transmission in the first or second system, and is released at the time of the reception.

The third parallel connection point 3 corresponding to the third and fourth systems is connected to a fourth parallel connection point 4 via a diode (switching element) 11, which is connected to the ground at the time of the transmission in the third or fourth system and becomes conductive at the time of the reception, and an equivalent quarter wavelength phase shift circuit 42. Other circuit connected to the fourth parallel connection point 4 is composed of a diode (switching element for transmission) 12, which is connected to a common terminal Tx (DCS/PCS) on the transmission side corresponding to the third and fourth systems, becomes conductive at the time of the transmission in the third or fourth system, and is released at the time of the reception. In addition, the second parallel connection point 2 and the fourth parallel connection point 4 are connected in parallel to each other with using the antenna terminal Ant as a common terminal via the low-frequency pass filter 21 and the high-frequency pass filter 41, respectively.

Next, the transmitting and receiving operations of each system will be concretely described. For example, in the transmitting operation of the first or second system, positive control voltage is applied to a control terminal Vcont-Tx (EGSM/GSM 850). The control voltage turns on the diode 10 on the transmission path and puts the diode 9 on the reception path to the ground. More specifically, as shown in FIG. 10, the transmitting power from the HPA for the first or second system is inputted to the transmitting terminal Tx (EGSM/GSM 850) and supplied to the antenna terminal through the diode 10 on the transmission path, the second parallel connection point 2 and the low-frequency pass filter 21. At this time, if seen via the equivalent quarter wavelength phase shift circuit 22, the impedance in the reception side from the second parallel connection point 2 is the very high impedance, that is, released because the diode 9 on the reception path is connected to the ground. Therefore, it scarcely influences the passage of the transmitting power. Consequently, the transmitting power inputted to the transmitting terminal is hardly attenuated and supplied to the antenna terminal.

At the time of the reception in the first or second system, the control terminal voltage to the Vcont-Tx (EGSM/GSM 850) is set to 0 V. More specifically, the diodes of the transmission path and the reception path are both in an off state. Therefore, the receiving signal from the antenna terminal reaches the first parallel connection point 1 through the low-frequency pass filter 21 and the second parallel connection point 2. In this case, the receiving signal at fR(1) is outputted to the output terminal for reception Rx (GSM 850) through the filter (GSM 850) 27 because the filter (EGSM) 24 becomes high impedance at fR(1) as described above. Similarly, the receiving signal at fR(2) is outputted to the output terminal for reception Rx (EGSM) through the filter (EGSM) 24 because the filter (GSM 850) 27 becomes high impedance at fR(2) as described above.

Next, the transmitting and receiving operations of the third and fourth systems will be described. For example, in the transmitting operation of the third or fourth system, positive control voltage is applied to a control terminal Vcont-Tx (DCS/PCS). The control voltage turns on the diode 12 on the transmission path and puts the diode 11 on the reception path to the ground. More specifically, as shown in FIG. 10, the transmitting power from the HPA for the third or fourth system is inputted to the transmitting terminal Tx (DCS/PCS) and supplied to the antenna terminal through the diode 12 on the transmission path, the fourth parallel connection point 4 and the high-frequency pass filter 41. At this time, if seen via the equivalent quarter wavelength phase shift circuit 42, the impedance in the reception side from the fourth parallel connection point 4 is the very high impedance, that is, released because the diode 11 on the reception path is connected to the ground. Therefore, it scarcely influences the passage of the transmitting power. Consequently, the transmitting power inputted to the transmitting terminal is hardly attenuated and supplied to the antenna terminal.

At the time of the reception in the third or fourth system, the control terminal voltage to the Vcont-Tx (DCS/PCS) is set to 0 V. More specifically, the diodes of the transmission path and the reception path are both in an off state. Therefore, the receiving signal from the antenna terminal reaches the third parallel connection point 3 through the high-frequency pass filter 41 and the fourth parallel connection point 4. In this case, the receiving signal at fR(3) is outputted to the output terminal for reception Rx (DCS) through the filter (DCS) 44 because the filter (PCS) 47 becomes high impedance at fR(3) as described above. Similarly, the receiving signal at fR(4) is outputted to the output terminal for reception Rx (PCS) through the filter (PCS) 47 because the filter (DCS) 44 becomes high impedance at fR(4) as described above. Also, in this circuit configuration, the control currents in the transmission, that is, the control current in the transmission in the first or second system is almost equal to the control current in the transmission in the third or fourth system (within the range of ±20%), and the baseband IC controlling the current and the interface between the IC and the circuit configuration can be realized in the same circuit. Therefore, it is possible to simplify the design.

As described above, the switch-type antenna duplexer having the above configuration can process the quad-band transmitting and receiving signals corresponding to the first to fourth systems shown in FIG. 1. Each of the transmitting signals from the transmitting terminal is supplied to the antenna terminal and each of the receiving signals from the antenna terminal is filtered and then outputted to the output terminals for reception. Also, it is possible to achieve the good characteristic that the control current is required only in the transmitting operation and is not required in the reception waiting time in which demand for the power consumption is severe.

Also, this configuration is particularly effective for the system in which fR(1) partially overlaps fT(2) or fR(3) partially overlaps fT(4). In the transmission in the second or fourth system, the transmitting power thereof passes through the pass band of the receive filter of the first system or the third system. Therefore, the attenuation by the filter cannot be expected and there is the possibility that the low-noise amplifier for reception is broken. In this configuration, since minimum number of switching elements (for example, diode) and minimum number of control terminals are used and the reception path is connected to the ground in the transmission time, it is possible to ensure the attenuation regardless of the receive filter. As a result, this configuration is particularly effective for the system in which fR(1) partially overlaps fT(2), or fR(3) partially overlaps fT(4).

Second Embodiment

Figure 3:
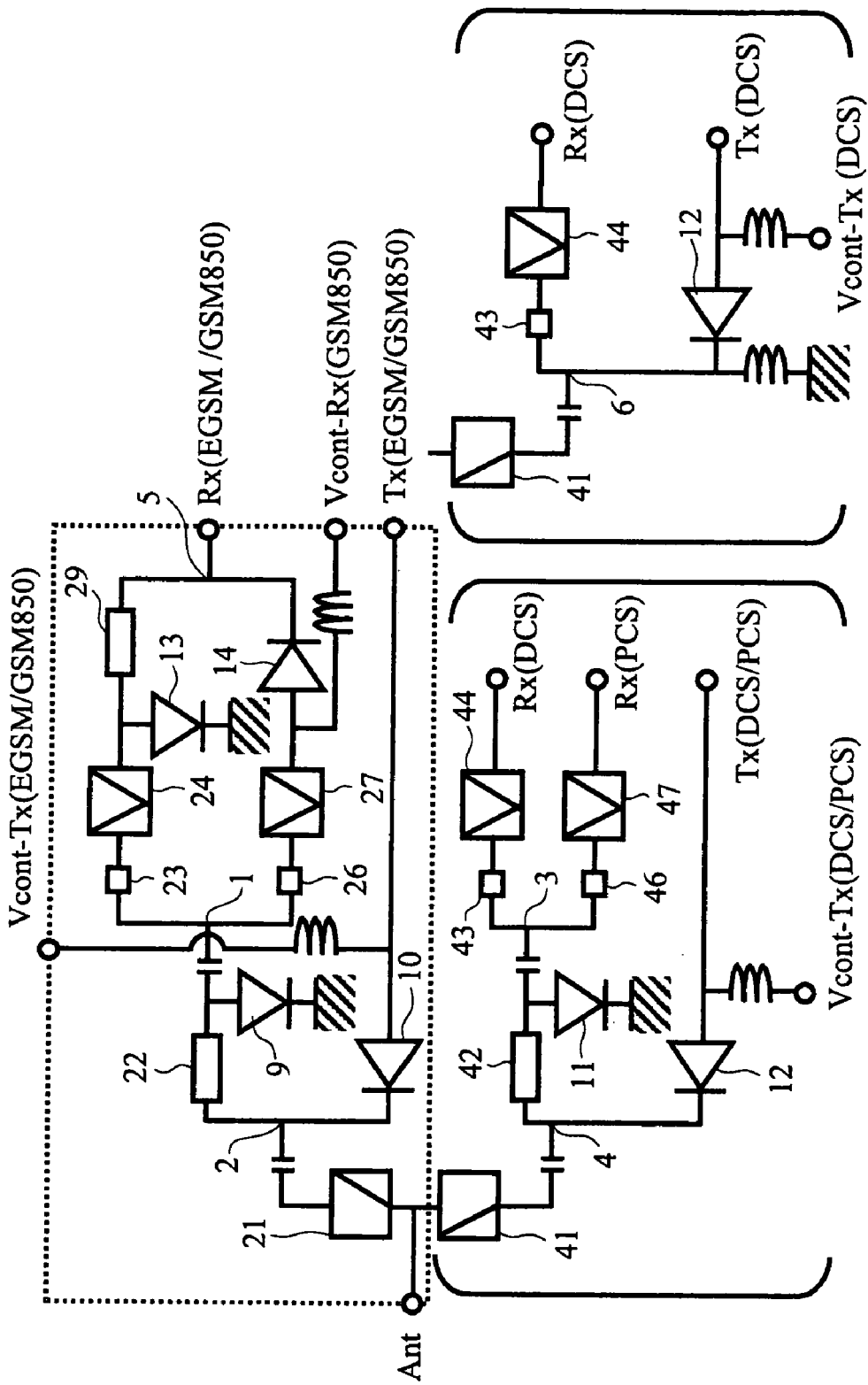
FIG. 3 is a block diagram showing a multiband switch type antenna duplexer according to the second embodiment of the present invention.
Figure 4:
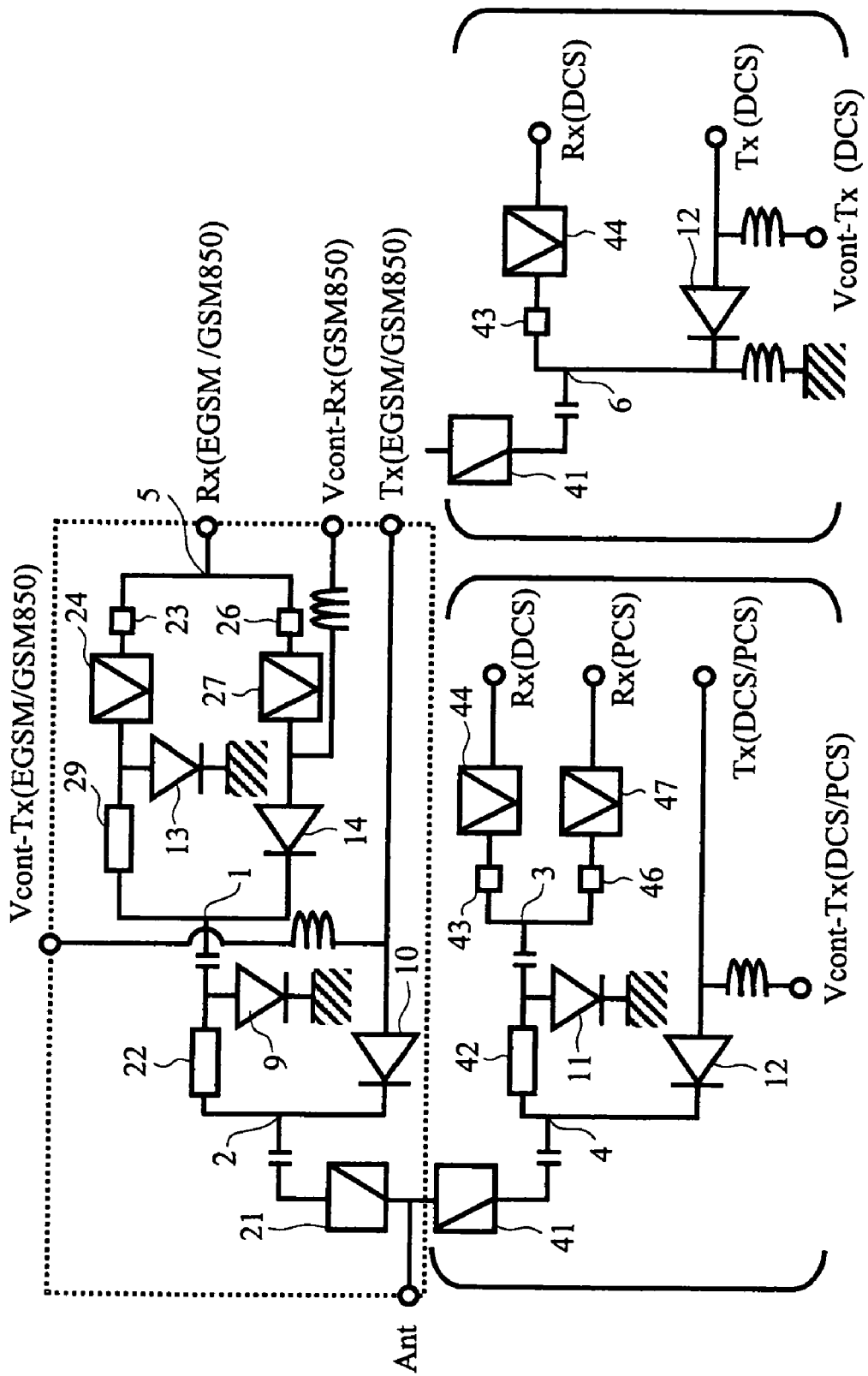
FIG. 4 is a block diagram showing another multiband switch type antenna duplexer according to the second embodiment of the present invention.

Subsequently, FIG. 3 and FIG. 4 shown an example of the second embodiment of the present invention. This configuration is common to the RF circuit for multiband switch-type antenna duplexer such as dual band, triple band and quad band and more. In general, the number of RF-IC pins is increased with the development of the multiband operation, and it is expected that the problem of the number of pins will become severer in the future. An object of the configuration of this proposal is to solve the problem.

The RF circuit with the configuration of this embodiment is effective for the system in which fT(1)<fR(2) is satisfied and fR(1) partially overlaps fT(2) when the transmitting and receiving frequency bands of the first system are denoted as fT(1) and fR(1) and the transmitting and receiving frequency bands of the second system are denoted as fT(2) and fR(2).

In FIG. 3, the first system is, for example, the GSM 850 and the second system is, for example, the EGSM. The circuit enclosed by the dotted lines is the newly proposed RF circuit, and the part in the parentheses is the circuit components to be added when the quad-band or triple-band antenna duplexer is formed. The receive filters (GSM 850) 27 and (EGSM) 24 corresponding to the first and second systems are provided. On the input side of the filters, the input terminals thereof are connected in parallel to each other via matching circuit/phase-shift circuits 26 and 23 under the condition that, at the frequency in the pass band of each filter, the impedance in the other filter becomes high impedance (that is, the condition that the impedance in the filter (EGSM) 24 becomes high impedance at fR(1) and the impedance in the filter (GSM 850) 27 becomes high impedance at fR(2)), and the first parallel connection point 1 is formed.

The first parallel connection point 1 is connected to the second parallel connection point 2 via a diode (switching element) 9, which is connected to the ground at the time of the transmission in the first or second system, and the equivalent quarter wavelength phase shift circuit 22. Other circuit connected to the second parallel connection point 2 is composed of a diode (switching element for transmission) 10, which is connected to a common input terminal on the transmission side corresponding to the first and second systems and is released at the time of the reception in the first or second system. The second parallel connection point 2 is connected to the antenna terminal via the low-frequency pass filter 21 or the high-frequency pass filter 41 (an example of using the low-frequency pass filter 21 is shown in FIG. 3) or directly connected to the antenna terminal without the filter (because filter is not always necessary particularly in the dual-band operation).

The output terminal of the receive filter corresponding to the first system and the output terminal of the receive filter corresponding to the second system are connected in parallel to each other via a diode (switching element) 14, which becomes conductive at the time of the reception in the first system and is released at the time of the reception in the second system, and via a diode (switching element) 13, which is connected to the ground at the time of the reception in the first system and becomes conductive at the time of the reception in the second system, respectively, and an equivalent quarter wavelength phase shift circuit 29, and a third parallel connection point 5 is formed. This third parallel connection point 5 is the output terminal for reception Rx (EGSM/GSM 850) and used as the common terminal of the first and second systems. By doing so, the number of receiving terminals can be reduced, and it is possible to solve the problem of the increase in the number of pins.

The operation in the transmission and reception in each system will be concretely described. In FIG. 3, when the circuit components in the left parentheses are added, the circuit configuration for the quad band is obtained, and when the circuit components in the right parentheses are added, the circuit configuration for the triple band is obtained. Also, when the circuit components in the parentheses are not added and the low-frequency pass filter 21 is removed, the circuit configuration for the dual band is obtained. The basic operation is identical to that of the upper half of FIG. 2, that is, that of the first and second systems. However, at the time of the reception in the first system, the positive control voltage is further applied to the control terminal Vcont-Rx (GSM 850). The control voltage turns on the diode on the reception path of the first system and puts the diode on the reception path of the second system to the ground. More specifically, the receiving signal at fR(1) is outputted to the common output terminal for reception Rx (EGSM/GSM 850) through the filter (GSM 850) 27. At this time, the impedance from the third parallel connection point 5 to the filter (EGSM) 24 via the equivalent quarter wavelength phase shift circuit 29 becomes the high impedance because the diode on the reception path of the second system is connected to the ground. Therefore, the filter (EGSM) 24 does not influence the receiving signal of fR(1).

Next, at the time of the reception in the second system, the control terminal voltage to the Vcont-Tx (GSM 850) is set to 0 V. More specifically, the diodes of the first and second transmission paths are both in an off state. Therefore, the receiving signal of fR(2) is outputted to the output terminal for reception Rx (EGSM/GSM 850) through the filter (EGSM) 24. At this time, since the diode 14 of the reception path of the first system is in an off state, the impedance from the third parallel connection point 5 to the filter (EGSM) 24 becomes the high impedance. Therefore, the receiving signal of fR(2) is not influenced. As described above, the shared use of the receiving terminals of the first and second systems can be realized.

In general, passive elements such as filters have the reciprocity, and the characteristics thereof are not changed even when the input and the output are inverted. FIG. 4 shows another example of the configuration obtained by modifying the configuration of FIG. 3. In the configuration of FIG. 4, the input/output relation in the circuit between the first parallel connection point 1 and the third parallel connection point 5 of FIG. 3 is inverted. The resultant circuit is shown in FIG. 4. In FIG. 4, it can be easily understood that the electrical properties are equal to those of the circuit in FIG. 3 due to the reciprocity of the passive elements. It is evident that the present invention includes the configuration of FIG. 4.

More specifically, in FIG. 4, the input terminals on the output side of the receive filters (GSM 850) 27 and (EGSM) 24 corresponding to the first and second systems are connected in parallel to each other via the matching circuit/phase-shift circuits 26 and 23, and the third parallel connection point 5 is formed. The input terminal of the receive filter corresponding to the first system and the input terminal of the receive filter corresponding to the second system are connected in parallel to each other via a diode (switching element) 14, which becomes conductive at the time of the reception in the first system and is released at the time of the reception in the second system, and via a diode (switching element) 13, which is connected to the ground at the time of the reception in the first system and becomes conductive at the time of the reception in the second system, and an equivalent quarter wavelength phase shift circuit 29, respectively, and the first parallel connection point 1 is formed.

Third Embodiment

Figure 5:
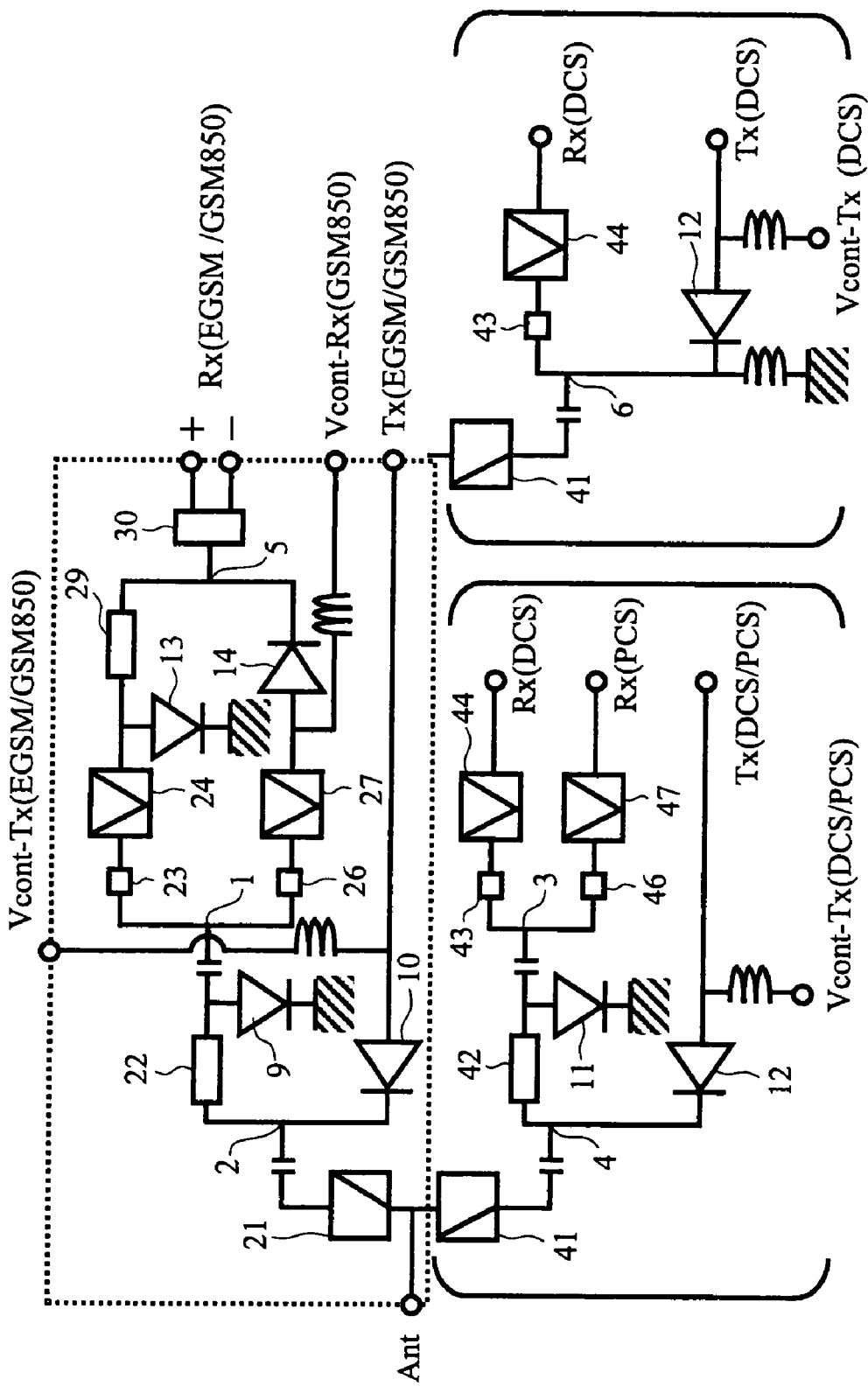
FIG. 5 is a block diagram showing a multiband switch type antenna duplexer according to the third embodiment of the present invention.
Figure 6:
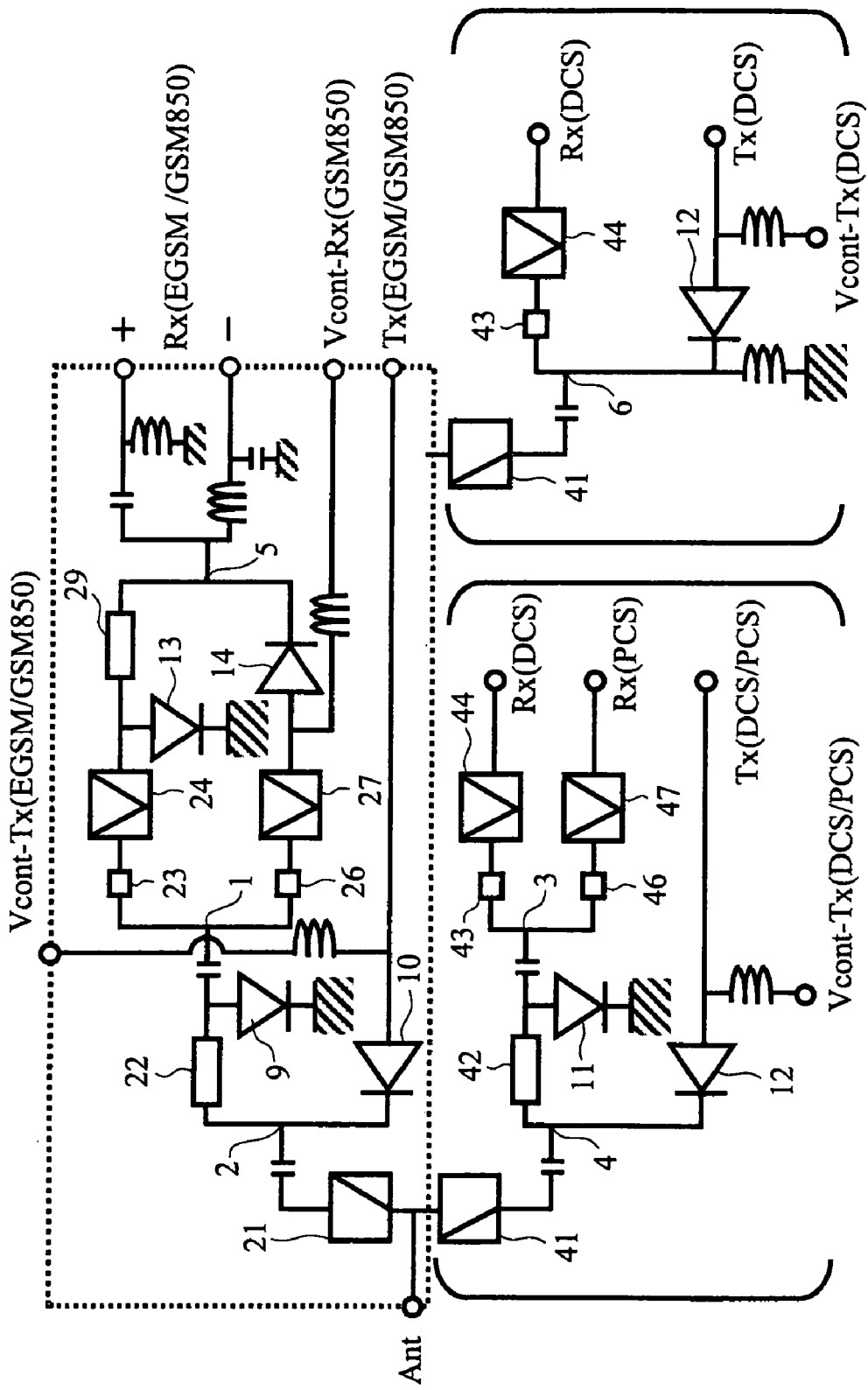
FIG. 6 is a block diagram showing a multiband switch type antenna duplexer (specific balun circuit) according to the third embodiment of the present invention.
Figure 7:
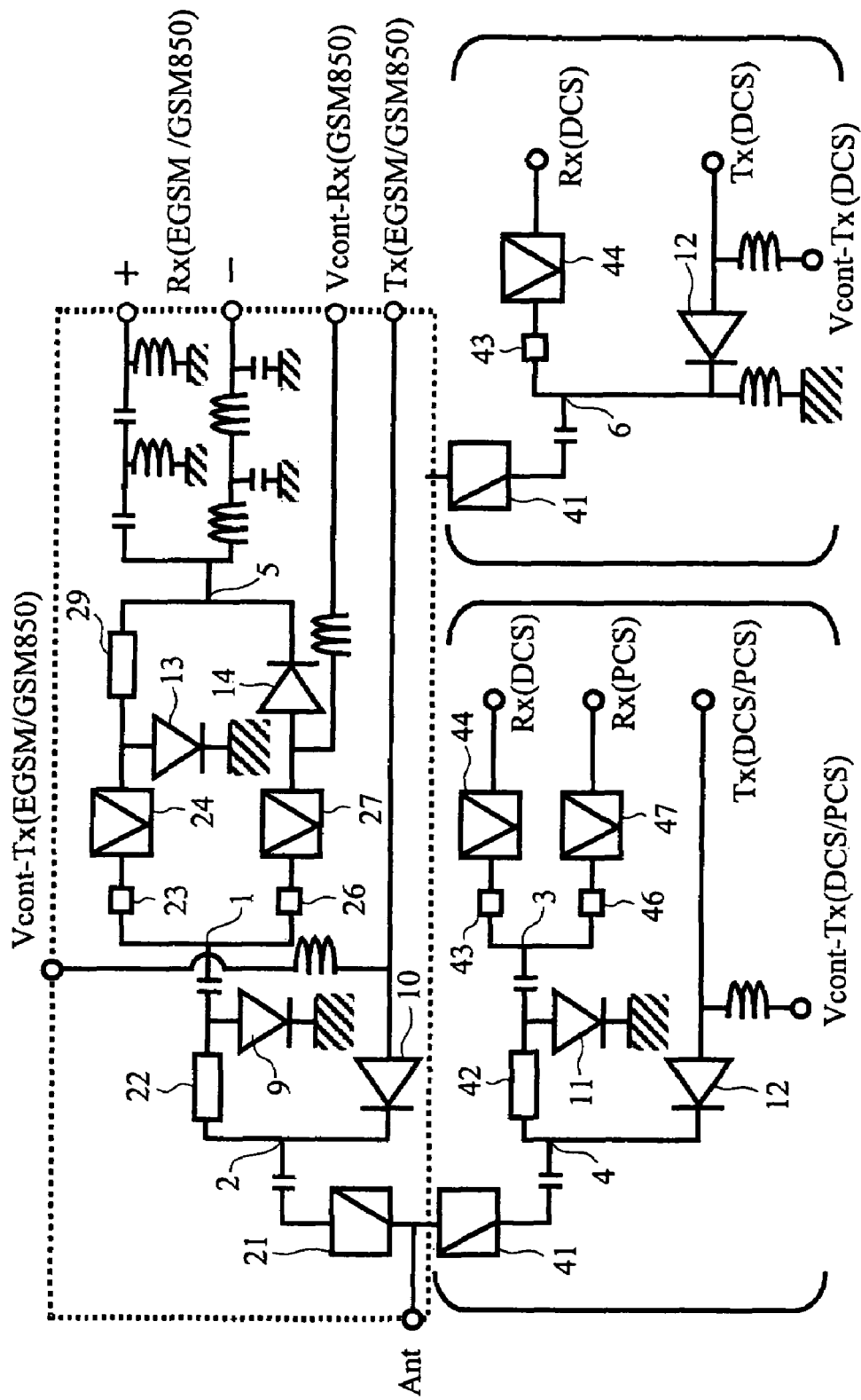
FIG. 7 is a block diagram showing a multiband switch type antenna duplexer (another specific balun circuit) according to the third embodiment of the present invention.

Subsequently, FIG. 5 to FIG. 7 show an example of the third embodiment of the present invention. In the circuit in FIG. 5, a balun circuit 30 is introduced between the third parallel connection point 5 and the common terminal for reception in the circuit of FIG. 3 or FIG. 4 (example of using the circuit of FIG. 3 is shown in FIG. 5), so that the common output terminal for reception is changed to the differential output terminal. By doing so, since not only the number of receiving terminals but also the number of balun circuits can be reduced, the simplification of the entire circuit and the cost reduction can be achieved. FIG. 6 shows a concrete example of an embodiment including the balun circuit of FIG. 5. More specifically, the balun circuit is formed of the circuit composed of the serial arm inductance and the parallel arm capacitance from the side of the parallel connection point 5 between the third parallel connection point 5 and one of the differential output terminals (−) and the circuit composed of the serial arm capacitance and the parallel arm inductance from the side of the parallel connection point 5 between the third parallel connection point 5 and the other of the differential output terminals (+). As a result, the amplitude balance variation of the differential output of ±1.5 dB or less and the phase balance variation thereof of ±15° or less can be realized so as to correspond to both of the first and second systems.

FIG. 7 shows another example of an embodiment including the balun circuit of FIG. 5. More specifically, the balun circuit is formed of the circuit composed of the serial arm inductance, parallel arm capacitance, serial arm inductance and the parallel arm capacitance from the side of the parallel connection point 5 between the third parallel connection point 5 and one of the differential output terminals (−) and the circuit composed of the serial arm capacitance, parallel arm inductance, serial arm capacitance and the parallel arm inductance from the side of the parallel connection point 5 between the third parallel connection point 5 and the other of the differential output terminals (+). As a result, the amplitude balance variation of the differential output of ±1.0 dB or less and the phase balance variation thereof of ±10° or less can be realized for both of the first and second systems.

Although the demand for the balance of the receiving output signal differs depending on the system design of the receiver unit of the wireless terminal, the amplitude variation of ±1.0 to ±1.5 dB or less and the phase variation of ±10 to ±15° or less are demanded in general. The circuit configuration described above can satisfy the demands of the system design.

Fourth Embodiment

Figure 8:
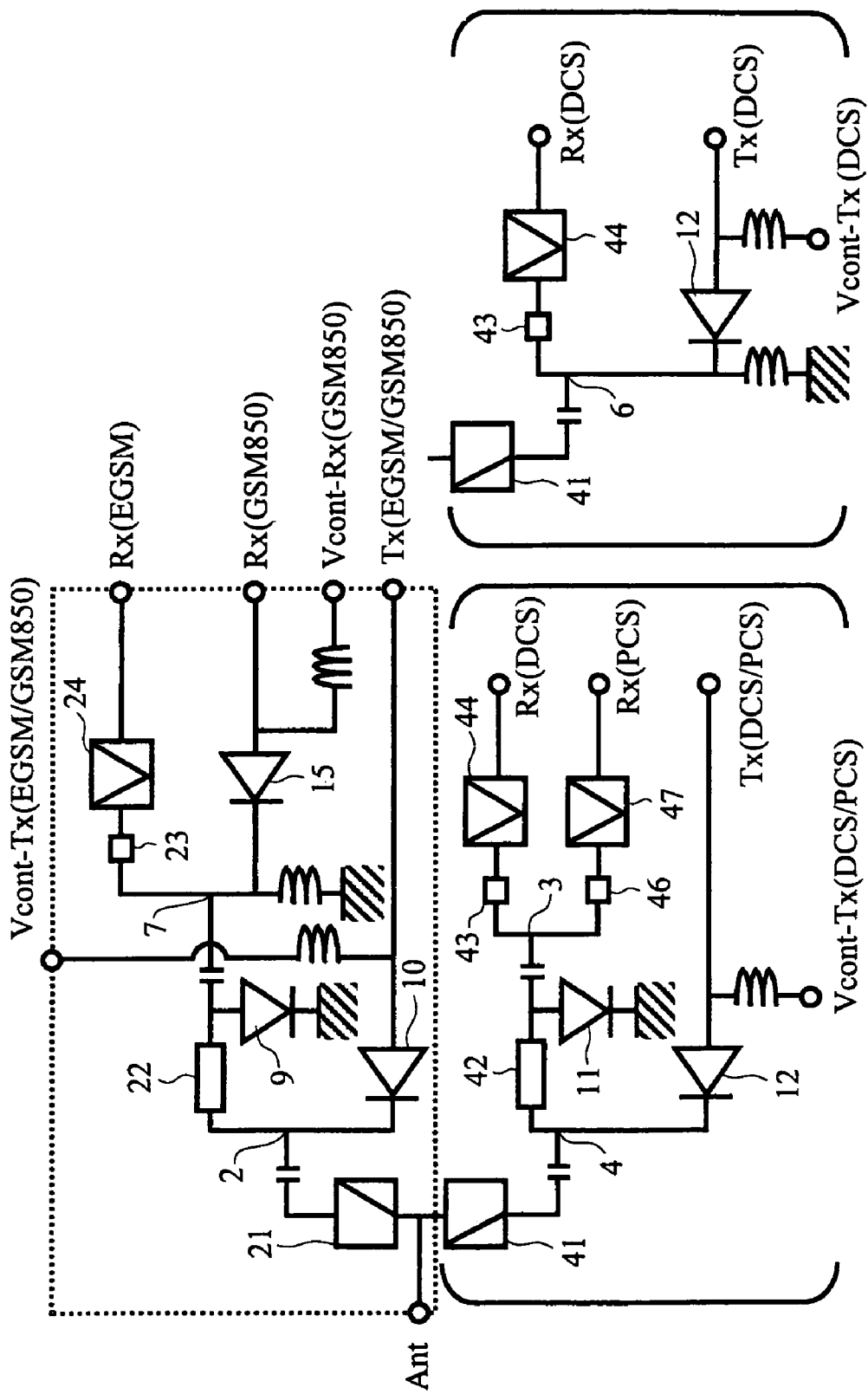
FIG. 8 is a block diagram showing a multiband switch type antenna duplexer according to the fourth embodiment of the present invention.

Subsequently, FIG. 8 shows an example of the fourth embodiment of the present invention. This configuration is common to the RF circuit for multiband switch-type antenna duplexer such as dual band, triple band and quad band and more. The RF circuit with the configuration of this embodiment is effective for the system in which fT(1)<fR(2) is satisfied and fR(1) partially overlaps fT(2) when the transmitting and receiving frequency bands of the first system are denoted as fT(1) and fR(1) and the transmitting and receiving frequency bands of the second system are denoted as fT(2) and fR(2). In FIG. 8, the first system is, for example, the GSM 850 and the second system is, for example, the EGSM. The circuit enclosed by the dotted lines is the newly proposed RF circuit, and the part in the parentheses is the circuit components to be added when the quad-band or triple-band antenna duplexer is formed.

The receive filter (EGSM) 24 for the second system is provided. However, the receive filter (GSM 850) for the first system is not provided. The filter (EGSM) 24 is connected in parallel to the diode (switching element for reception) 15 connected to the output terminal for reception Rx (GSM 850), and a first parallel connection point 7 is formed. Also, the switching element for reception is turned on and off by the control terminal Vcont-Rx (GSM 850). Other circuit configuration is the same as that of the second embodiment described above. However, since the GSM 850 is the system in the United States, the filter (GSM 850) is not always necessary in the terminal used in Europe. Therefore, it is possible to use the switching element instead like in this circuit configuration. If the external filter is added to the terminal Rx (GSM 850) according to need and the positive voltage is applied to the Vcont-Rx (GSM 850) at the time of the reception in the first system, the function similar to the RF circuit for multiband switch type antenna duplexer shown in FIG. 2 and others can be realized. According to the circuit configuration, there are a lot of merits from the aspect of the cost and mass production. For example, the shared use of the board for the triple-band or quad-band wireless terminal can be realized.

Fifth Embodiment

Figure 9:
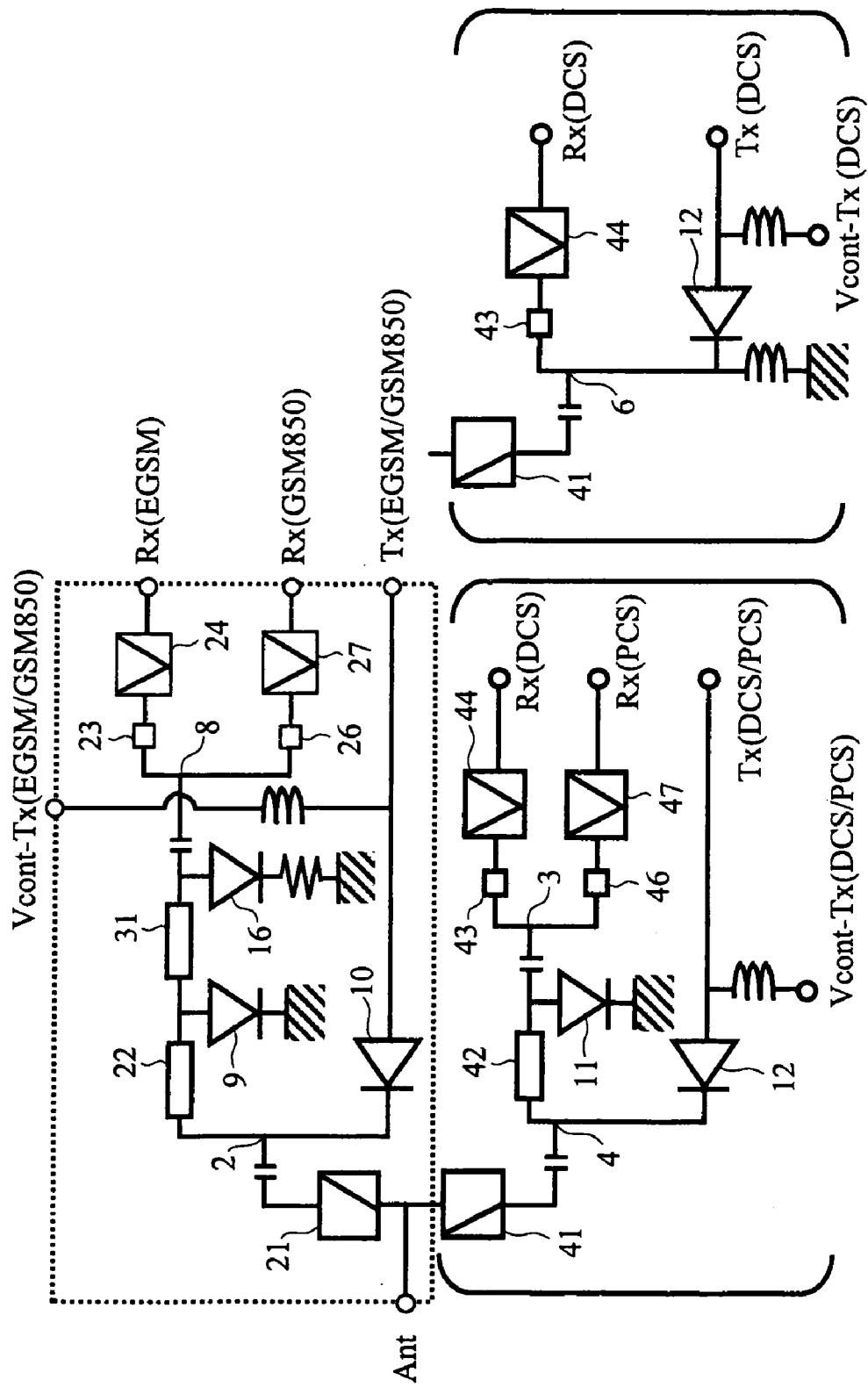
FIG. 9 is a block diagram showing a multiband switch type antenna duplexer according to the fifth embodiment of the present invention.

Subsequently, FIG. 9 shows an example of the fifth embodiment of the present invention. This configuration is common to the RF circuit for multiband switch-type antenna duplexer such as dual band, triple band and quad band and more. The RF circuit with the configuration of this embodiment is effective for the system in which fT(1)<fR(2) is satisfied and fR(1) partially overlaps fT(2) when the transmitting and receiving frequency bands of the first system are denoted as fT(1) and fR(1) and the transmitting and receiving frequency bands of the second system are denoted as fT(2) and fR(2). In FIG. 9, the first system is, for example, the GSM 850 and the second system is, for example, the EGSM. The circuit enclosed by the dotted lines is the newly proposed RF circuit, and the part in the parentheses is the circuit components to be added when the quad-band or triple-band antenna duplexer is formed.

The receive filters corresponding to the first system and the second system are provided, and the output terminal for reception is independently formed on the output side of the filters. Also, on the input side, the input terminals are connected in parallel to each other via the matching circuit and the phase shift circuit, and a first parallel connection point 8 is formed. The first parallel connection point 8 is connected in parallel to the diode (switching element for reception) 10, which is connected to the common input terminal on the transmission side corresponding to the first and second systems, becomes conductive at the time of the transmission in the first or second system and is released in the reception, via the diode (switching element) 16 which is connected to the ground via a resistor at the time of transmission in the first system or the second system and becomes conductive at the time of the reception and the equivalent quarter wavelength phase shift circuit 31 and via the diode (switching element) 9 which is connected to the ground at the time of the transmission in the first or second system and becomes conductive at the time of the reception and the equivalent quarter wavelength phase shift circuit 22, and the second parallel connection point 2 is formed. Similar to the embodiments described above, the second parallel connection point 2 is connected to the antenna terminal via the low-frequency pass filter 21 or the high-frequency pass filter 41 or directly connected without the filter.

The configuration described above is particularly effective for the DC demodulation system or the low IF demodulation system whose block diagram is shown in FIG. 10. In general, in such demodulation systems, it is necessary to perform the calibration of the direct current offset. It is necessary to block the receiving wave and the interfering wave incident from an antenna before this calibration is performed. The simplest way is to apply the positive voltage to the transmission control terminal, for example, the Vcont-Tx (EGSM/GSM 850) of FIG. 10 at the time of waiting, thereby putting the diode on the reception path to the ground. By doing so, it is possible to block the incident wave from the antenna. However, if seen from a receiver side, the impedance in the input side from the filter, for example, the filter (GSM 850) 27 and (EGSM) 24 is shorted out, and this state is different from the state at the time of reception. Therefore, it is impossible to perform the accurate calibration.

The circuit configuration shown in FIG. 9 is designed to solve the problem above. When the positive voltage is applied to the Vcont-Tx (EGSM/GSM 850), the diode 9 is connected to the ground. Therefore, similar to the example shown in FIG. 2 and others, the impedance from the second parallel connection point 2 via the equivalent quarter wavelength phase shift circuit 22 becomes the high impedance. Meanwhile, since the impedance from the first parallel connection point 8 via the equivalent quarter wavelength phase shift circuit 31 also becomes the high impedance, the substantial impedance from the parallel connection point 8 becomes only the resistance via the diode 16 in an on state. Consequently, by setting this resistance so as to be equal to the radiation impedance of the antenna, the impedance in the input side from the filter (GSM 850) 27 and (EGSM) 24 can be kept always constant. As a result, the improvement of the calibration accuracy and the performance improvement of the terminal can be realized.

Figure 11:
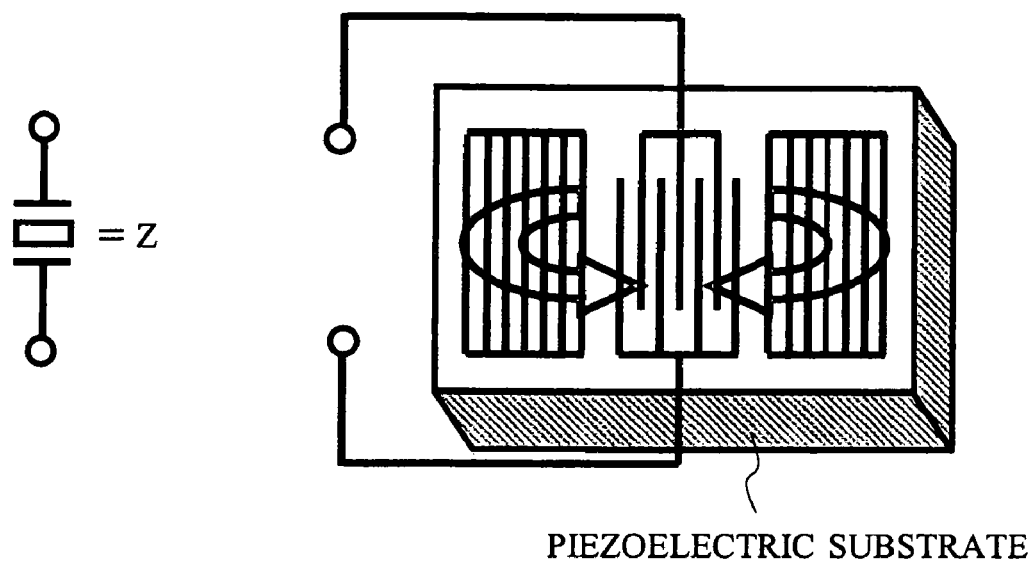
FIG. 11 is a diagram showing the SAW resonator according to an embodiment of the present invention.
Figure 12:
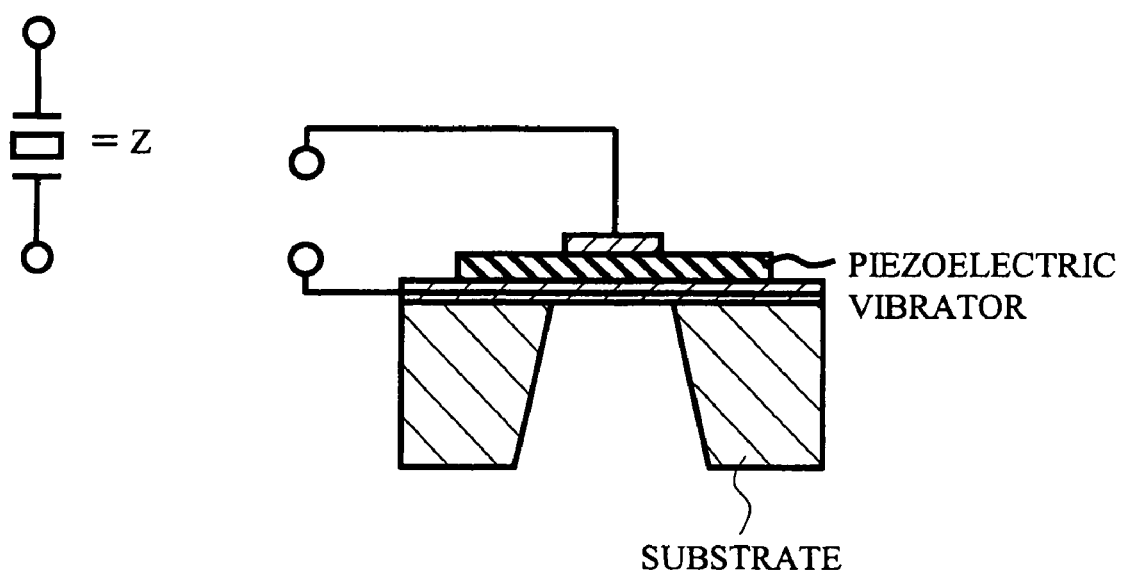
FIG. 12 is a diagram showing the FBAR resonator according to an embodiment of the present invention.

Next, FIG. 11 and FIG. 12 show an example of a resonator to be the basis of the filter used in the present invention. FIG.

Figure 13:
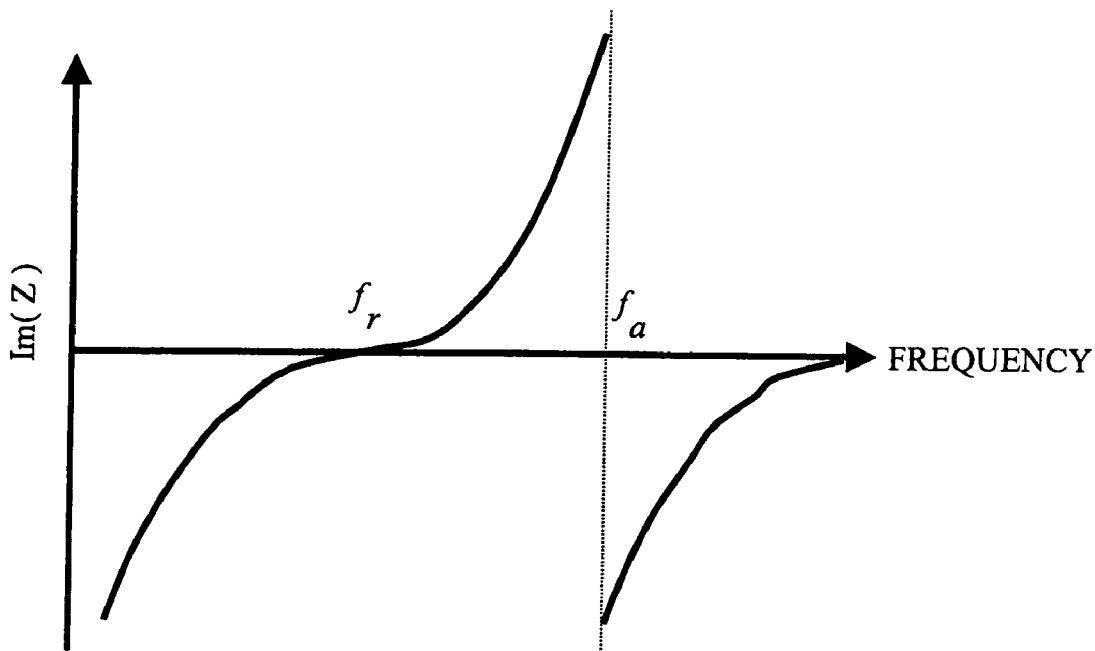
FIG. 13 is a diagram showing the impedance characteristics of the SAW resonator and the FBAR resonator according to an embodiment of the present invention.

11 shows the surface acoustic wave (SAW) resonator, which is formed on the basis of the comb-shaped electrodes (Interdigital Transducer: IDT) on a piezoelectric substrate. FIG. 12 shows the film bulk acoustic resonator (FBAR), which is realized by forming a piezoelectric vibrator in a form of diaphragm on a substrate made of Si. FIG. 13 shows the impedance characteristics of the resonators of FIG. 11 and FIG. 12. In general, the good resonator has the large impedance difference between the resonance frequency fr and the antiresonance frequency fa.

Figure 14:
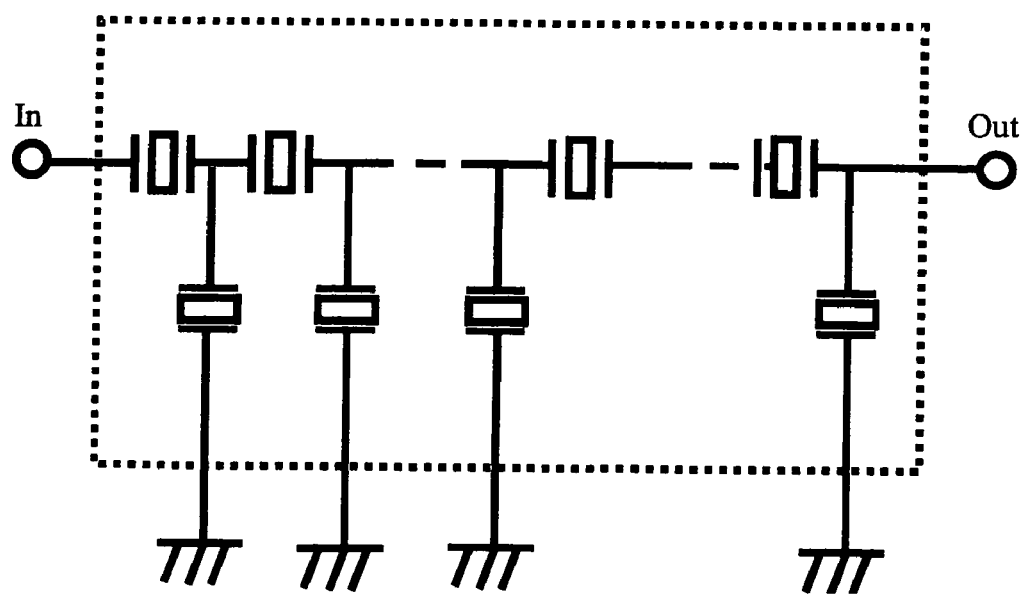
FIG. 14 is a diagram showing a ladder type filter according to an embodiment of the present invention.
Figure 15:
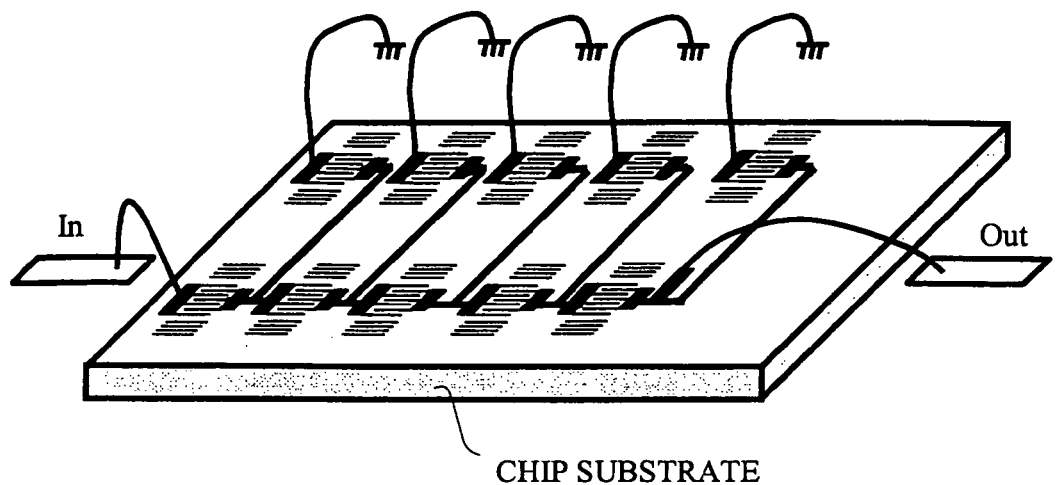
FIG. 15 is a diagram showing the SAW filter according to an embodiment of the present invention.
Figure 16:
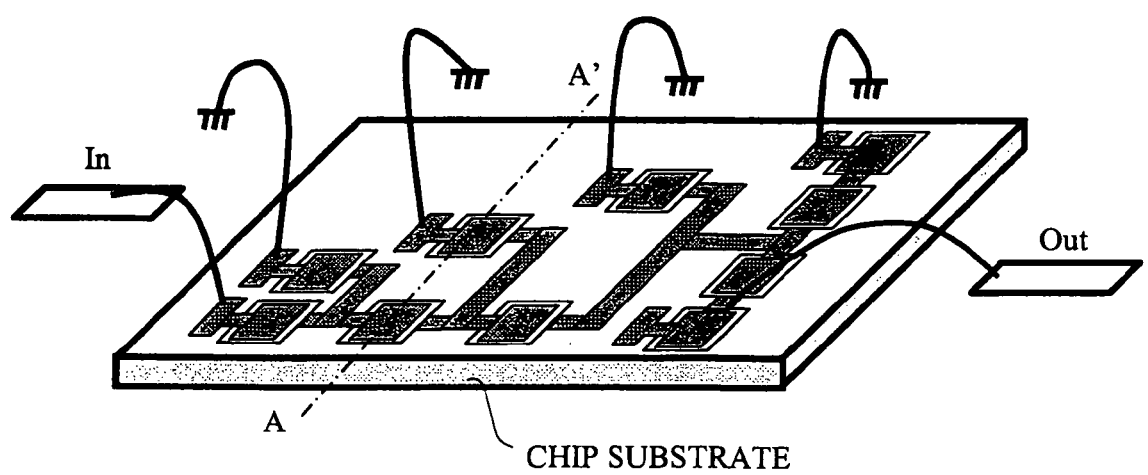
FIG. 16 is a diagram showing the FBAR filter according to an embodiment of the present invention.
Figure 17:
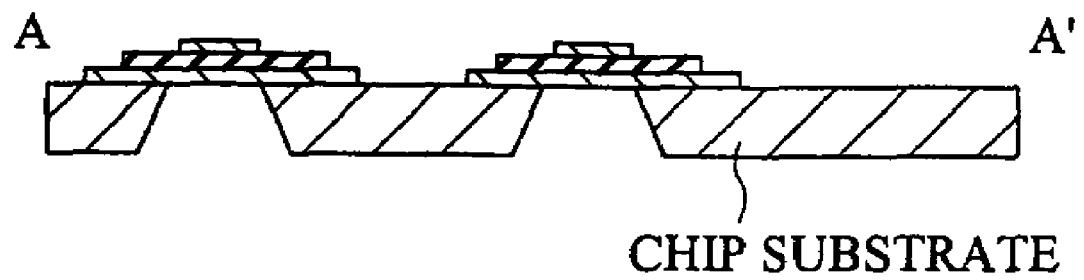
FIG. 17 is a cross-sectional view showing the FBAR filter according to an embodiment of the present invention.

FIG. 14 shows an example of the filter in which these resonators are incorporated into a ladder-type circuit. In order to realize the equivalent filter shown in FIG. 14 with the SAW and the FBAR, a plurality of resonators are formed on a single chip substrate as shown in FIG. 15 which shows the case of the SAW and FIG. 16 which shows the case of FBAR (cross-sectional view thereof is shown in FIG. 17). In the examples shown in FIG. 2 to FIG. 10, the SAW filter and the FBAR filter shown in FIG. 15 and FIG. 16 are used as the filters. Therefore, the chip-level filter can be realized, and thus, the size of the multiband switch type antenna duplexer can be further reduced.

Figure 18:
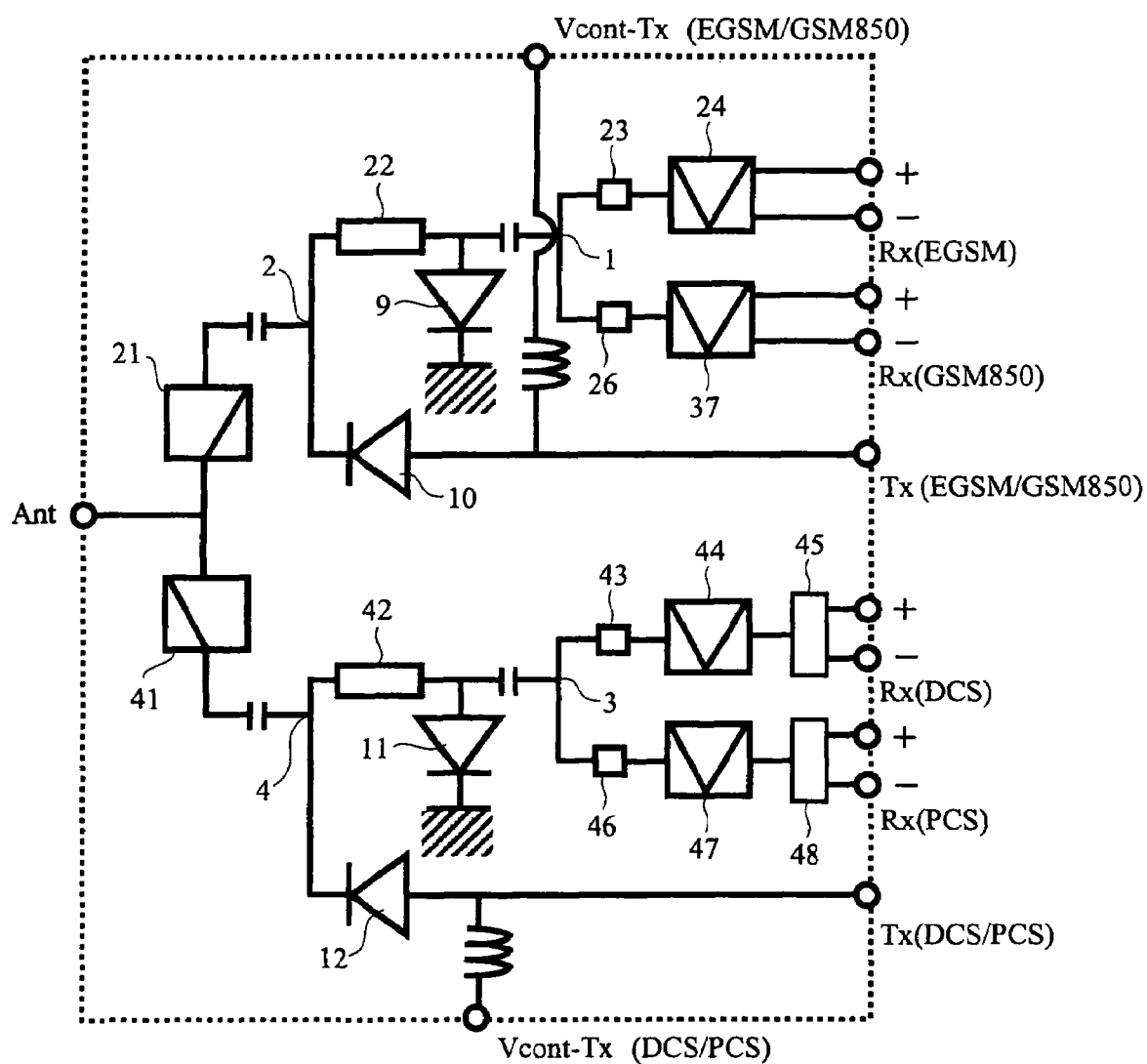
FIG. 18 is a block diagram showing a multiband switch type antenna duplexer according to an embodiment of the present invention.

Since both of the ladder type filters shown in FIG. 15 and FIG. 16 have the single ended input and the single ended output, if the balun circuit is introduced to the output, the balanced output can be obtained. In particular, some SAW filters having the single ended input and the balanced output have been developed recently, and if such filters are used as the filters for EGSM and GSM 850 as shown in FIG. 18, the balanced output can be obtained even if the balun circuit is not introduced. It is evident that the present invention includes such a combination. Also, the diode is used as the switching element in the description above. However, a switch made of compound semiconductor such as GaAs or a mechanical switch such as MEMS (Micro-Electronic-Mechanical Systems) are also available, and it is evident that the present invention includes such a combination.

Also, the present invention is effective in the TDMA (Time Division Multiple Access) system, for example, in the GSM system which has become a popular mobile phone system in Europe, the United States, China and others, and it makes a significant contribution to the size reduction of the multiband switch type antenna duplexer and thus the size reduction of the wireless terminal itself.

The effect obtained by the representative one of the inventions disclosed in this application will be briefly described as follows.

More specifically, for a mobile phone used in the TDMA system such as the GSM system which has been adopted in 60% or more of the world, a multiband switch type antenna duplexer with a new configuration necessary to achieve the multiband terminal is provided. Consequently, the size reduction and the performance improvement of the terminal can be realized.

What is claimed is:

1. A multiband switch type antenna duplexer in which signals of different first and second frequency bands, respectively, share a single antenna, wherein:

a transmitting frequency band $f_T$ and a receiving frequency band $f_R$ of said first and second frequency bands are respectively denoted as $f_T(1)$ and $f_R(1)$ and $f_T(2)$ and $f_R(2)$, in the case where $f_T(1)<f_R(2)$ is satisfied and $f_R(1)$ partially overlaps $f_T(2)$, a first receive filter corresponding to said first frequency band and a second receive filter corresponding to said second frequency band are provided, output terminals on the output side of said receive filters are connected in parallel to each other via a matching circuit and a phase shift circuit, thereby forming a third parallel connection point, and said third parallel connection point is used as an output terminal for reception, the input terminal of the receive filter corresponding to said first frequency band and the input terminal of the receive filter corresponding to said second frequency band are connected in parallel to each other, via a first switching element which becomes conductive at the time of the reception of the signals of said first frequency band and is released at the time of the reception of the signals of said second frequency band and via a second switching element which is connected to the ground at the time of the reception of the signals of said first frequency band and becomes conductive at the time of the reception of the signals of said second frequency band and a quarter wavelength phase shift circuit, respectively, thereby forming a first parallel connection point, a control terminal which controls both said first switching element and said second switching element is provided between said first switching element and said first receive filter corresponding to said first frequency band, said first parallel connection point is connected in parallel to a switching element for transmission, which is connected to a common input terminal on the transmission side corresponding to said first and second frequency bands, becomes conductive at the time of the transmission of the signals of said first or second frequency band, and is released at the time of the reception, via a switching element which is connected to the ground at the time of the transmission of the signals of said first or second frequency band and becomes conductive at the time of the reception and a quarter wavelength phase shift circuit, thereby forming a second parallel connection point, and said second parallel connection point is directly connected to an antenna terminal or connected to the antenna terminal via a low-frequency pass filter or a high-frequency pass filter.

* * * * *

UNITED STATES PATENT AND TRADEMARK OFFICE
CERTIFICATE OF CORRECTION

PATENT NO. : 7,659,795 B2
APPLICATION NO. : 12/216646
DATED : February 9, 2010
INVENTOR(S) : M. Hikita et al.

Page 1 of 1

It is certified that error appears in the above-identified patent and that said Letters Patent is hereby corrected as shown below:

ON THE TITLE PAGE

Please correct (73) Assignee to read as follows:

(73) Assignees: ~~Hitachi, Ltd., Tokyo, (JP);~~ Hitachi Media Electronics Co., Ltd., Mizusawa (JP)

Signed and Sealed this
Twenty-fourth Day of May, 2011

David J. Kappos
*Director of the United States Patent and Trademark Office*